United States Patent [19]

Kasai et al.

[11] Patent Number: 5,217,796
[45] Date of Patent: Jun. 8, 1993

[54] WOVEN MATERIAL OF INORGANIC FIBER AND PROCESS FOR MAKING THE SAME

[75] Inventors: Shin Kasai; Hideharu Waketa; Keiichi Kato; Yutaka Kawaguchi, all of Fukushima, Japan

[73] Assignee: Nitto Boseki Co., Ltd., Fukushima, Japan

[21] Appl. No.: 627,920

[22] Filed: Dec. 17, 1990

Related U.S. Application Data

[63] Continuation of Ser. No. 248,261, Sep. 19, 1988, abandoned, which is a continuation of Ser. No. 830,179, Feb. 18, 1986, abandoned.

[30] Foreign Application Priority Data

Feb. 19, 1985 [JP] Japan ................................ 60-31101

[51] Int. Cl.$^5$ ............................................. D03D 3/00
[52] U.S. Cl. ................................. 428/229; 428/225; 428/226; 428/228; 428/255; 428/273; 428/299; 428/408; 428/901; 428/902
[58] Field of Search ................. 428/91, 248, 251, 273, 428/209, 901, 229, 902, 408, 299, 225, 255, 299, 226, 228; 174/68.5

[56] References Cited

U.S. PATENT DOCUMENTS

| | | | |
|---|---|---|---|
| 2,150,652 | 3/1939 | Foster | 428/91 |
| 2,911,747 | 11/1959 | Sundt | 428/90 |
| 3,733,239 | 5/1973 | George | 161/89 |
| 4,092,453 | 5/1978 | Jonda | 428/902 |
| 4,389,453 | 6/1983 | Kitanaka et al. | 428/240 |
| 4,428,995 | 1/1984 | Yokono et al. | 428/273 |
| 5,030,493 | 7/1991 | Rich | 428/229 |

FOREIGN PATENT DOCUMENTS 2047291 11/1980 United Kingdom .

Primary Examiner—James J. Bell
Attorney, Agent, or Firm—Sixbey, Friedman, Leedom & Ferguson

[57] ABSTRACT

A woven material of inorganic fiber, and a process for making the same, are disclosed in which exposed surfaces of warps and wefts constituting the woven material are opened as a result of being impinged by jets of pressurized water, whereby the fibers on the surface of the woven material are uniformly raised.

5 Claims, 2 Drawing Sheets

FIG. 2

WOVEN MATERIAL OF INORGANIC FIBER AND PROCESS FOR MAKING THE SAME

This application is a continuation of Ser. No. 07/248,261, filed Sep. 19, 1988, now abandoned, which itself was a continuation of Ser. No. 07/830,179 filed Feb. 18, 1986 now abandoned.

BACKGROUND OF THE INVENTION

This invention relates to a woven material of inorganic fiber, and a process for making the same, suitable for reinforcing various kinds of resin and for, specially, use as printed circuit boards.

Use has been made of woven materials of inorganic fiber such as glass, carbon or alumina fiber and those of glass fiber are particularly in wide use for reinforcing resin and recently as printed circuit boards.

Inasmuch as such a woven material of inorganic fiber contains a higher percentage of inorganic fiber, it possesses an excellent reinforcing effect.

However, a printed circuit board prepared from a laminated woven material of inorganic fiber is disadvantageous in that it is subject to interlamina shear and is inferior with regard to surface smoothness.

In the case of glass fibers constituting a woven material, for instance, the fiber comprises several hundred monofilaments each 5~9 $\mu$ in diameter and they are slightly twisted to form yarn, which is used as warps and wefts of the woven material. The inorganic fibrous filaments are thus considerably restrained through the twisting and weaving processes.

Consequently, the inorganic fibrous filaments forming warps and wefts restrain each other although they offer an excellent reinforcing effect as a reinforcing material because of the high percentage of inorganic fiber contained therein. In other words, the portions where wefts are passed over and under warps are swollen and, when the woven material is impregnated with resin and formed into a board, surface roughness caused by the woven material will appear, the disadvantage being insufficient surface smoothness.

The above-described surface smoothness is important when woven materials of inorganic fiber are piled up and used as a laminar board and, particularly in the case of a printed circuit board, improved surface smoothness is important for the electronic parts industry because of the improved wiring density and pattern micronization.

Although the surface smoothness in the case of the present standard double-sided board (1.6 mm thick) is about 7~9 $\mu$, there is an increasing need to reduce the smoothness to about 3 $\mu$.

Moreover, as several hundred ends of inorganic fibers are twisted and bundled to form a warp or weft, the warps and wefts constituting a woven material are barely impregnated with resin. The fact that the warps and wefts are barely impregnated with resin affects not only the productivity of boards prepared from laminar inorganic fibers directly but also their mechanical, thermal and electric characteristics because of the non-homogeneous distribution of resin.

Because inorganic fibers are not oriented in between woven materials of inorganic fiber to be piled up when the woven materials of inorganic fiber are piled up, both woven materials are not fully adhesive bonded and they may be subject to interlamina shear.

Attempts have been made to improve the construction of yarn forming a woven material, by using a nonwoven fabric or providing the woven material with shearing force using a roller to improve the surface smoothness and impregnability. Various methods also have been attempted to prevent interlamina shear in a woven material of inorganic fiber by needle punching the woven material for raising purposes. In that case of use of a nonwoven fabric, although such methods have been proved effective in the improvement of surface smoothness and prevention of interlamina shear, the adhesive agent used to maintain the form of the nonwoven fabric must be compatible with the resin with which the nonwoven fabric is impregnated, because the filaments of the nonwoven fabric have not been leno woven nor restrained with each other. Because the filaments of the nonwoven fabric are not restrained with each other, moreover, the percentage of the inorganic fiber contained is less than half the total (about 30%) and the disadvantage is that the dimensional stability of the nonwoven fabric is reduced because the reinforcing effect is naturally reduced. Improvements in yarn constituting the woven material and the use of a roller for providing shearing force are not satisfactory enough to solve the above-described problems.

Even if the woven material is needle punched to reduce the interlamina shear, the yarn constituting the material may be completely cut or destroyed or a shear in weaving will be produced, or otherwise many portions of the woven material will be left without being needle punched because of the difference between the woven density of the material and the needle punching density, the greater of the material and the needle punching density, the greater difference between the shape of the needle punching and the construction of the woven material, and because of the punching method. Consequently, uniform raising and a process for thickly growing features are practically impossible to carry out. Moreover, the cut or destroyed constructive yarn will make the woven material uneven. In the case of the needle punching, the surface smoothness may be reduced because the woven material is composed of portions which have been punched and unpunched.

SUMMARY OF THE INVENTION

An object of the present invention is to provide a woven material of inorganic fiber affording excellent mechanical strength and dimensional stability by remedying shortcomings such as lack of surface smoothness, as in the case with a conventional reinforced board using a woven material of inorganic fiber and of uniform resin impregnation, and reducing the interlamina shear in a laminar woven material of inorganic fiber.

Another object of the present invention is to provide a process for making such a woven material of inorganic fiber.

A woven material of inorganic fiber obtained by weaving inorganic fibers according to the present invention is characterized in that the exposed surfaces of warps and wefts constituting the woven material are opened. Further, the woven material of inorganic fiber obtained by weaving inorganic fibers is characterized in that the exposed surfaces of warps and wefts constituting the woven material are opened and each of them is raised so that the woven material may be thickly covered with uniform microfine feathers. Further, a process for making the woven material of inorganic fiber according to the present invention comprises impinging jets of pressurized water from a plurality of nozzles onto the woven material obtained by weaving inorganic fibers, the propellent pressure being controllable.

The woven material of inorganic fiber according to the present invention uses a yarn composed of several hundred monofilaments each 5~9 μ in diameter, and inorganic fibers which are usable include glass, carbon and alumina fibers.

A process for making such a woven material will be first described. A high pressure water jet having a plurality of small caliber rotary nozzles (about 0.1~0.2 mm in diameter) arranged at equal intervals in the transverse direction of a woven material is used to impinge jets of water onto the woven material while the plurality of nozzles, each with an eccentricity of about 10 mm from the axis, are rotated (2,000~3,000 rpm) and reciprocated 50~500 times and preferably 100~300 times per minute to cover a distance of 10~20 mm in the transverse direction of the woven material.

In this case, the apparatus is equipped with a stainless steel net on the lower surface of the woven material and means, well draining, for receiving jets of pressurized water to prevent the woven material from being deformed by the jet energy and permit the direct transmission of the jet energy onto the woven material. The jets of pressurized water must be uniformly impinged onto the woven material. The high pressure water jet used in this embodiment is so constructed that the jet pressure can be properly regulated.

The high pressure water jet may be provided with a plurality of pressure resistant pipes, instead of the rotary nozzles, each having a plurality of small diameter holes provided along the axis thereof. The pressure resistant pipes are arranged at equal intervals and the positions of the holes are shifted and arranged in the transverse direction of a woven material. The pressure resistant pipes are reciprocated in the transverse direction of the woven material so that jets of pressurized water may uniformly be impinged from the small diameter holes onto the woven material.

DETAILED DESCRIPTION OF THE INVENTION

Figure 3:
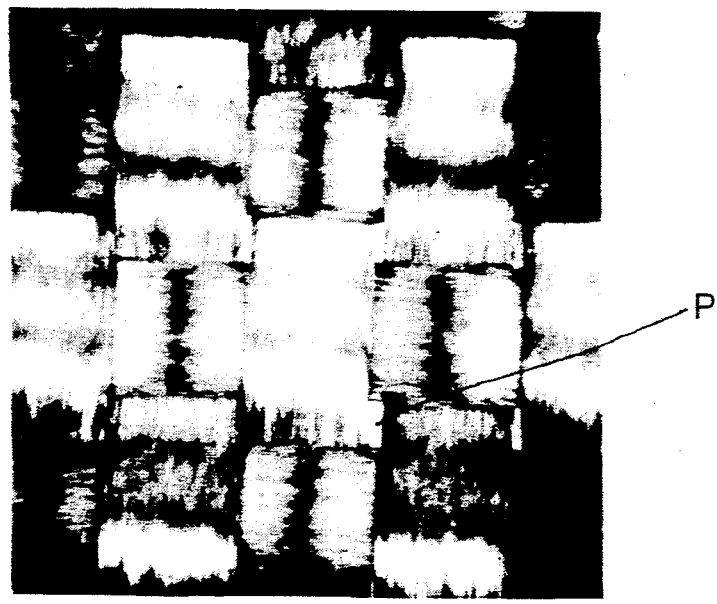
FIG. 3 is a micrograph showing the surface of a woven material of inorganic fiber with no jets of pressurized jets applied thereto.

FIG. 3 is a micrograph (50 magnifications) showing the surface of a woven material of inorganic fiber with no jets of pressurized water applied thereto. The warps and wefts constituting the woven material are band-like respectively composed of dense filaments and a gap (P) is formed in the portion where the warp is passed under the weft.

Figure 1:
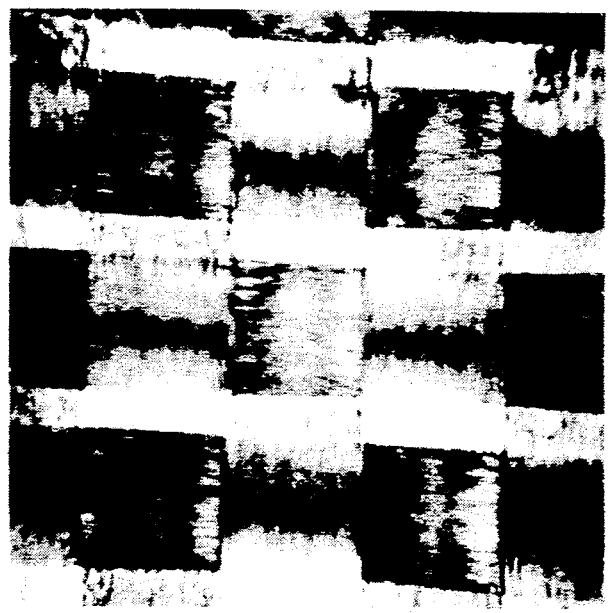
FIG. 1 is a micrograph showing the surface of a woven material of inorganic fiber with jets of pressurized water applied thereto.

On the contrary, FIG. 1 is a micrograph (same magnifications) illustrating the surface of the same woven material of inorganic fiber with jets of pressurized water applied thereto and each of the band-like warps and wefts constituting the woven material is seen to come loose and open. Accordingly, this process spreads the individual filaments composing the fibers. In doing so, the gap P between the warps and wefts of the woven material will be reduced. Although not shown in FIG. 1, the surface of attributable to the intersections of warps and wefts, and the smoothness of the surface of the woven material has been improved greatly. Improvements in the opening and surface smoothness of the warps and wefts shown in FIG. 1 can be attained at a high water jet pressure of about 30~150 kg/cm$^2$.

Figure 2:
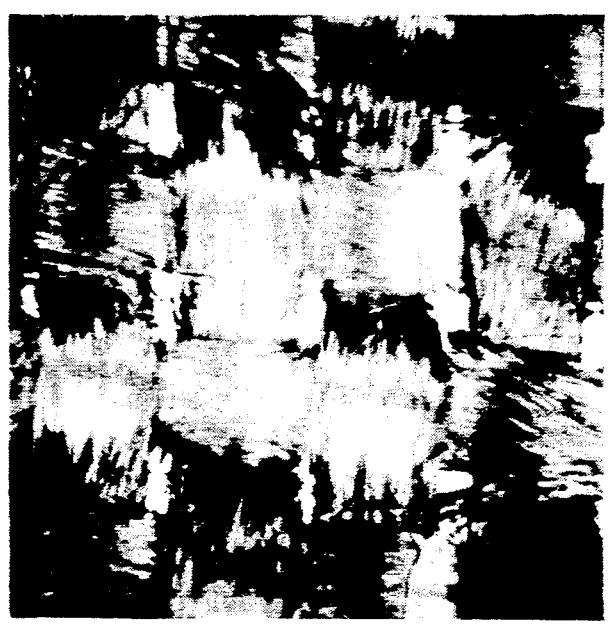
FIG. 2 is a micrograph showing the surface of a woven material of inorganic fiber with jets of pressurized water applied thereto at a pressure of 150–1,000 kg/cm$^2$.

FIG. 2 is a micrograph (same magnifications) showing the state of a surface of a woven material of inorganic fiber when jets of pressurized water are applied thereto at a pressure of about 150~1,000 kg/cm$^2$, preferably 200~500 kg/cm$^2$. The exposed surfaces of the warps and wefts each are seen to uniformly rise, come loose and open. This loosening and opening of the exposed surfaces of the warps and wefts is done so as to spread the individual filaments composing the fibers. As will be appreciated by those skilled in the art, FIG. 2 is a micrograph of a specific sample and the degree to which the warps and wefts rise, come loose and open may vary from that shown form one woven material to another and depending on the specific pressure of the jets applied within the noted range, a fact which is reflected by the variance in the degrees of opening shown for two different materials at various pressures, in Table 3, below.

As shown in FIGS. 1 and 2, if the warps and wefts constituting the woven material of inorganic fiber are in such a condition that they have come loose and opened, the impregnating rate will be greatly enhanced when the woven material is impregnated with a resin solution and the woven material can uniformly be impregnated therewith.

When the woven material of inorganic fiber thus obtained is used as a resin reinforcing material, it affords excellent dimensional stability as well as mechanical strength because the formation of the woven material is not injured and it simultaneously has a surface smoothness that has heretofore been unattainable.

As shown in FIG. 2, moreover, the exposed band-like warps and wefts on the surface of the woven material are caused to come loose and open by increasing the jet pressure of the high pressure water jet and the surface of the warps and wefts can be uniformly raised. When the raised woven material of inorganic fiber is impregnated with resin and a prepreg sheet is piled thereon, the uniformly raised fibers exhibit an anchor effect on the sheet piled, so that the peeling resistant effect is improved by a large margin.

The raised fibers on the surface permit an increase in the percentage of the resin contained therein and the surface smoothness will be further improved through hardening and forming.

Moreover, the woven material of inorganic fiber according to the present invention requires only simple operation wherein jets of pressurized water are impinged, whereby it is possible to ensure smooth operation, permit the woven material of inorganic fiber to be impregnated quickly, and uniformly and improve work efficiency.

By regulating the jet pressure of the high pressure water jet according to the present invention, woven materials can be properly selected whose warps and wefts are opened and furthermore those having warps and wefts whose surfaces are raised. Moreover, selected woven materials of inorganic fiber can be manufactured depending upon the purpose of use.

The invention will be further described by reference to the following specific Examples.

EXAMPLE 1

In order to show the properties of various woven materials of glass fiber obtained according to the present invention, a description will be given of changes in woven material conditions due to the jet pressure of the high pressure water jet, the surface smoothness, and interlamina shear of laminar boards employing the woven materials. The high pressure water jet used in the Examples was an "Extra High Pressure Water Processing Equipment" described in Japanese Patent No. 57-22692, and Table 1 below shows the operating conditions.

TABLE 1

| Conditions | Jet Pressure ($kg/cm^2$) | Nozzle Diameter (mm) | rpm of Nozzle | Eccentricity of Nozzle (mm) | (*1) Distance (mm) | (*2) Velocity (m/min) |
| --- | --- | --- | --- | --- | --- | --- |
| Example 1 | 50 | 0.1 | 2,000 | 10 | 50 | 3 |
| Example 2 | 100 | " | " | " | " | " |
| Example 3 | 200 | " | " | " | " | " |
| Example 4 | 300 | " | " | " | " | " |
| Example 5 | 500 | " | " | " | " | " |

Note
(*1) Distance between the woven material face and nozzle.
(*2) Travel velocity of the woven material.

The woven materials of continuous filament glass fiber used in the Examples were [WE18WBZ$_2$] and [WE116EBZ$_2$] of Nitto Boseki Co., Ltd., sold commercially which have the band-like warps and wefts, and Table 2 shows the specifications thereof.

TABLE 2

|  | ME18WBZ$_2$ | WE116EBZ$_2$ |
| --- | --- | --- |
| Construction | Plain weave | Plain weave |
| Yard used: |  |  |
| Warp | ECG751/0 | ECE2251/0 |
| Weft | " | " |
| Density: Warp × Weft (ends/25 mm) | 43 × 34 | 59 × 57 |
| Mass (g/m$^2$) | 209 | 104 |
| Surface finishing agent | Epoxy silane | Epoxy silane |

Subsequently, the woven materials of glass fiber obtained according to the present invention were subjected to (1) an air permeability test, (2) a tensile strength test, (3) a resin impregnation test and (4) a resin content test to check the condition of the woven materials under the influence of the jet pressure of the high pressure water jet. The properties of the laminar boards prepared from the woven materials of glass fiber were thus made clear in terms of data (5) on the surface smoothness of the laminar boards and (6) interlamina shear within the laminar board.

(1) Air Permeability Test

Table 3 shows the air permeability of the woven materials of glass fiber when jets of pressurized water are uniformly impinged on the surfaces thereof.

TABLE 3

| | Jet Pressure (kg/cmz) | WE18WBZ$_2$ | WE116EBZ$_2$ |
| --- | --- | --- | --- |
| Comparative Example | — | 10.7 | 52.0 |

TABLE 3-continued

| | Jet Pressure (kg/cmz) | WE18WBZ$_2$ | WE116EBZ$_2$ |
| --- | --- | --- | --- |
| Example 1 | 50 | 1.8 | 17.5 |
| Example 2 | 100 | 1.8 | 16.3 |
| Example 3 | 200 | 3.7 | 21.0 |
| Example 4 | 300 | 7.8 | 26.0 |
| Example 5 | 500 | 15.2 | 48.0 |

Note:
The test was made in accordance with JIS L 1056 [Permeability Test Method A]

As will be seen from Table 3, the woven material treated with jets of water permits the warps and wefts thereof to open and thus causes the permeability thereof to change. When the jet pressure is lower than 200 kg/cm$^2$, as shown in Table 3 the gaps decrease due to the opening of the warps and wefts and the permeability thereof is reduced. As seen in Table 3, a point at which the permeability begins to increase occurs somewhere between below 200 kg/cm$^2$. When the pressure is thus over 300 kg/cm$^2$, the permeability thereof increases markedly because the warps and wefts are raised.

(2) Tensile Strength Test

Table 4 shows the tensile strength of the woven materials of glass fiber obtained in Examples 1~5 of the Tables.

TABLE 4

| | | (Unit: kg/25 mm) | | | |
| --- | --- | --- | --- | --- | --- |
| | Jet Pressure (kg/cm$^2$) | WE18WBZ$_2$ | | WE116EBZ$_2$ | |
| | | Warp | Weft | Warp | Weft |
| Comparative Example | — | 65.6 | 45.2 | 35.1 | 30.0 |
| Example 1 | 50 | 64.7 | 44.4 | 34.8 | 29.9 |
| Example 2 | 100 | 60.0 | 42.0 | 34.5 | 29.6 |
| Example 3 | 200 | 58.9 | 41.4 | 34.0 | 28.9 |
| Example 4 | 300 | 56.8 | 39.6 | 31.5 | 27.5 |
| Example 5 | 500 | 52.4 | 36.7 | 30.3 | 26.4 |

Note:
Test method: JIS R 3420 5.4 General Glass Fiber Test Method.

As shown in Table 4, the tensile strength of the woven material processed with jets of water is reduced. The tensile strength of WE18WBZ$_2$ and WE116EBZ$_2$ respectively becomes lower by roughly 20% and 15% than that of the Comparative Example at a jet pressure of 500 kg. From this it is inferred that jets of pressurized water appear to have reduced the parallelism of the filaments and damaged or broken them according to circumstances. However, the fact that the woven material processed with jets of water at a pressure of as high as 500 kg/cm$^2$ maintained about 80% of the strength showed it still retained the properties inherent in a woven material.

(3) Resin Impregnating Test

After the woven materials of glass fiber were processed with jets of pressurized water, the resin impregnating rates were measured. Table 5 shows the results obtained.

Epoxy resin having the following composition was used.

| | |
|---|---|
| Epicoat 1001 (epoxy resin of Shell Chemical Co.) | 100 parts by weight; |
| Dicyandiamide | 2 parts by weight; |
| Benzyldimethylamine | 0.2 part by weight; and |
| Methylozytole about | 100 parts by weight; |

TABLE 5

(Unit: min-sec)

| | Jet Pressure ($kg/cm^2$) | WE18WBZ$_2$ | WE116EBZ$_2$ |
|---|---|---|---|
| Comparative Example | — | 15'-42" | 7'-38" |
| Example 1 | 50 | 4'-30" | 1'-52" |
| Example 2 | 100 | 3'-02" | 1"-11" |
| Example 3 | 200 | 1'-22" | 33" |
| Example 4 | 300 | 18" | 14" |
| Example 5 | 500 | 15" | 8" |

The resin impregnating test was carried out in such a manner that fixed quantity of resin (10 ml) was dropped on the woven material having a fixed area (10 cm × 10 cm) and the time required until foam within the strands disappeared was measured.

As will be seen from Table 5, jets of water caused the warps and wefts to open and greatly improved the resin impregnating rate. The impregnating rate was improved by a large margin as the jet pressure increased. When the woven materials of inorganic fiber processed with jets of water are used as a reinforcing material for laminar boards, productivity is thus improved and, in the case of the same production speed, laminar boards afford excellent properties to the extent that the impregnating rate has been increased.

(4) Resin Content Test

Table 6 shows the results obtained from the resin content test using the prepreg sheets obtained by impregnating the woven materials, processed with jets of pressurized water, with resin. The same types of woven materials and resin as those in (1) and (2) were used. The prepreg sheet was to be prepared under the same conditions so that the blank resin content of the woven material [WE18WBZ$_2$] became 39% by weight. The test was made according to JIS-R3420, 5-3 [General Glass Fiber Test Method].

TABLE 6

(Unit: %)

| | Jet Pressure ($kg/cm^2$) | WE18WBZ$_2$ | WE116EBZ$_2$ |
|---|---|---|---|
| Comparative Examples | — | 39.0 | 48.0 |
| Example 1 | 50 | 41.6 | 50.0 |
| Example 2 | 100 | 43.2 | 54.1 |
| Example 3 | 200 | 46.7 | 58.8 |
| Example 4 | 300 | 52.5 | 67.4 |
| Example 5 | 500 | 58.3 | 78.5 |

As will be seen from Table 6, the resin content increased as the jet pressure was increased and, because the surfaces of the warps and wefts were raised at a jet pressure of over 200 kg/cm$^2$, the content is seen to become rather higher in value than the blank one.

(5) Laminar Board Surface Smoothness Test

Woven materials of glass fiber (WE18WBZ$_2$) processed with jets of pressurized water were used as top and bottom surfaces of a laminar board and six prepreg sheets prepared from woven materials of glass fiber without being processed with jets of pressurized water were sandwiched therebetween. Copper foils (18 μthick) were respectively piled on both top and bottom surfaces thereof. The resin used for the prepreg sheets was the same one used for the (3) resin impregnating test and the laminar board molding conditions were: press working pressure: 50 kg/cm$^2$, press curing temperature: 170° C.; and press curing time: 90 min.

Figure 4:
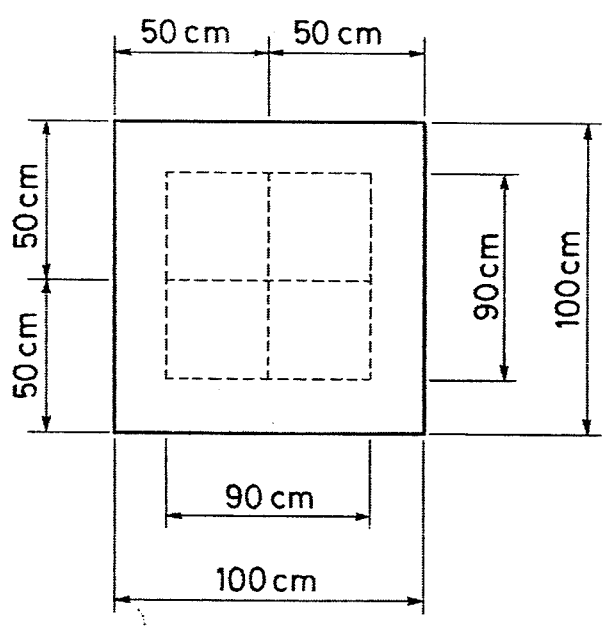
FIG. 4 is a diagram explanatory of a measuring method in a surface smoothness test.

The surface smoothness was based on JIS B0601 [Surface Roughness Measuring Method] and, as shown in FIG. 4, measurement was carried out in 10 places on each dotted line (60 places in total) within the surface of a 100 square cm sample, each place being 10 mm long, using a universal form measuring instrument (Model SEF-IA of Kosaka Kenkyusho K. K.). Table 7 shows the results obtained. For comparative purposes, this also shows the results obtained from a conventional product wherein 8 sheets of woven materials of glass fiber without being processed with jets of pressurized water are piled up.

TABLE 7

(Unit: μ)

| | Jet Pressure ($kg/cm^2$) | Measured Value | | |
|---|---|---|---|---|
| | | Min | Max | x̄ (*) |
| Conventional Product | — | 7.2 | 9.3 | 7.9 |
| Example 1 | 50 | 5.4 | 7.4 | 6.2 |
| Example 2 | 100 | 4.6 | 6.5 | 5.0 |
| Example 3 | 200 | 3.8 | 4.7 | 3.7 |
| Example 4 | 300 | 2.7 | 3.6 | 2.8 |
| Example 5 | 500 | 1.9 | 3.2 | 2.2 |

Note:
(*) n = mean value of 60.

As will be seen from Table 7, the surface smoothness of a laminar board employing the woven material of glass fiber processed with jets of water at a jet pressure of 300 kg/cm$^2$ was ×3 μ or less. The surface smoothness can be improved considerably to the extent that the value obtained was less than half that of the conventional product.

(6) Interlamina Shear Test

As woven materials of glass fiber (WE18WBZ$_2$), the woven materials of glass fiber used in the Comparative Example and Examples 1-5 in (1), the air permeability test, were used. Prepreg sheets impregnated with the epoxy resin used in (3), the resin impregnating test, were piled on each of the woven materials and formed into a laminar board under the same conditions as those in (5), the laminar board surface smoothness test.

In the interlamina shear test, measurement was made by supporting three short beam points in conformity with ASTM D-234. Table 8 shows the results obtained. The measuring method and sample size are as follows:

| | | |
|---|---|---|
| The measuring method: | span | 12 mm |
| | loading rate | 2 mm/min |
| Sample size: | thickness | about 3.0 mm |
| | width | about 10 mm |

-continued

| | length | about 40 mm |
|---|---|---|

TABLE 8

| Laminar Board | Jet Pressure (kg/cm²) | Resin Content (% by weight) | Mean Measured Value (kg/mm²) |
|---|---|---|---|
| Conventional Product | — | 37.2 | 5.75 |
| Example 1 | 50 | 37.6 | 5.80 |
| Example 2 | 100 | 38.0 | 6.04 |
| Example 3 | 200 | 38.4 | 6.72 |
| Example 4 | 300 | 38.8 | 7.66 |
| Example 5 | 500 | 39.5 | 7.87 |

Note:
The mean measured value designates the mean value of n = 5 in the direction of the weft.

As will be seen from Table 8, the interlamina shear strength of the woven material processed with jets of water at a jet pressure of 100 kg cm² was improved about 5%, as compared with the conventional product, and as for the woven material at 300~500 kg cm², it was improved about 30~40% compared with the conventional one. In other words, the fibers raised by jets of water contribute to the prevention of interlamina shear.

Jets of pressurized water uniformly impinged onto a woven material of inorganic fiber permit yarn constituting the woven material to open while the properties inherent in the woven material remain. The fact that uniformly raised, broken and damaged fibers are produced by regulating the jet pressure improve resin impregnation by a large margin. Moreover, the surface smoothness of the woven material is also improvable because the intersections of warps and wefts are attacked.

As compared with conventional products, the surface smoothness of the laminar board employing the woven materials according to the present invention is considerably improved and the interlamina shear therein is also effectively prevented.

It will be obvious to those skilled in the art that many modifications may be made within the scope of the present invention without departing from the spirit thereof, and the invention includes all such modifications.

What is claimed:

1. In a woven material of inorganic fiber used for reinforcing various kinds of resin and obtained by weaving inorganic fibers, wherein each of the warps and wefts constituting said woven material is band-like and comprises a continuous filament yarn, having a number of twisted continuous filaments, said warps and wefts having been substantially uniformly loosened and opened widthwise relative to their originally woven form at the exposed surface of said woven material by the effect of pressurized jets of water, from a plurality of nozzles, having been impinged on the woven material, so that the distance between said filaments has been widened to facilitate uniform impregnation of said woven material with resin.

2. In a woven material of inorganic fiber used for reinforcing various kinds of resin and obtained by weaving inorganic fibers, wherein each of the warps and wefts constituting said woven material are band-like and comprises a continuous filament yarn, having a number of twisted continuous filaments, said warps and wefts having been substantially uniformly loosened and opened widthwise relative to their originally woven form at the exposed surface of said woven material by the effect of pressurized jets of water, from a plurality of nozzles, having been impinged on the woven material, so that the distance between said filaments has been widened to facilitate uniform impregnation of said woven material with resin, and wherein said warps and wefts are raised due to some of said continuous filaments having been broken and damaged.

3. A woven material according to claim 1, wherein each of the warps and wefts is formed of approximately several hundred filaments, each filament having a diameter in a range of 5-9 microns.

4. A woven material according to claim 1, wherein said woven material is used as printed circuit boards.

5. A woven material according to claim 1, wherein said inorganic fibers are glass fibers.

* * * * *